United States Patent
Kobayashi et al.

(10) Patent No.: US 11,268,851 B2
(45) Date of Patent: Mar. 8, 2022

(54) PHOTOELECTRIC CONVERSION APPARATUS AND EQUIPMENT

(71) Applicant: CANON KABUSHIKI KAISHA, Tokyo (JP)

(72) Inventors: Hideo Kobayashi, Tokyo (JP); Fumihiro Inui, Yokohama (JP); Daisuke Yoshida, Ebina (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/884,236

(22) Filed: May 27, 2020

(65) Prior Publication Data

US 2020/0378828 A1 Dec. 3, 2020

(30) Foreign Application Priority Data

May 30, 2019 (JP) .............................. JP2019-101488

(51) Int. Cl.
*G01J 1/46* (2006.01)
*H01L 27/146* (2006.01)
*G01J 1/44* (2006.01)

(52) U.S. Cl.
CPC .......... *G01J 1/46* (2013.01); *H01L 27/14634* (2013.01); *H01L 27/14636* (2013.01); *G01J 2001/446* (2013.01)

(58) Field of Classification Search
CPC ........ G01J 1/46; G01J 1/44; G01J 2001/4446; G01J 2001/446; H01L 27/14634; H01L 27/14636; H01L 27/14643; H01L 27/14609; H01L 27/14603; H01L 27/14601; H01L 27/146; H04N 5/365; H04N 5/3651; H04N 5/3653; H04N 5/3658; H04N 5/378; H04N 5/379; H04N 5/369; H04N 5/3698

See application file for complete search history.

(56) References Cited

U.S. PATENT DOCUMENTS

| | | |
|---|---|---|
| 7,227,208 B2 | 6/2007 | Ogura et al. |
| 7,561,199 B2 | 7/2009 | Noda et al. |
| 7,719,587 B2 | 5/2010 | Ogura et al. |

(Continued)

FOREIGN PATENT DOCUMENTS

| | | |
|---|---|---|
| EP | 3468169 A1 | 4/2019 |
| JP | 2013-236222 A | 11/2013 |

(Continued)

OTHER PUBLICATIONS

U.S. Appl. No. 16/928,202, filed Jul. 14, 2020 (First Named Inventor: Hideo Kobayashi).

(Continued)

*Primary Examiner* — John R Lee
(74) *Attorney, Agent, or Firm* — Venable LLP (57) ABSTRACT

A photoelectric conversion apparatus includes a first substrate including a pixel array, a second substrate including a readout circuit configured to read out a signal from the pixel array, and a drive terminal to which a drive potential is externally applied. The readout circuit includes a first node to which the drive potential is supplied from the drive terminal via an electrically conductive line arranged in the pixel array, and a second node to which the drive potential is supplied from the drive terminal without going through the pixel array.

18 Claims, 8 Drawing Sheets

(56) References Cited

U.S. PATENT DOCUMENTS

| | | | |
|---|---|---|---|
| 7,990,440 B2 | 8/2011 | Kobayashi et al. | |
| 8,400,546 B2 | 3/2013 | Itano et al. | |
| 8,698,062 B2 | 4/2014 | Yoshida | |
| 8,710,558 B2 | 4/2014 | Inoue et al. | |
| 8,835,828 B2 | 9/2014 | Kobayashi | |
| 8,952,433 B2 | 2/2015 | Inui | |
| 9,159,750 B2 | 10/2015 | Ikeda et al. | |
| 9,264,641 B2 | 2/2016 | Kobayashi | |
| 9,357,122 B2 | 5/2016 | Kususaki et al. | |
| 9,407,839 B2 | 8/2016 | Yoshida | |
| 9,407,847 B2 | 8/2016 | Maehashi et al. | |
| 9,438,828 B2 | 9/2016 | Itano et al. | |
| 9,509,931 B2 | 11/2016 | Kobayashi et al. | |
| 9,538,112 B2 | 1/2017 | Wada et al. | |
| 9,602,752 B2 | 3/2017 | Kobayashi et al. | |
| 9,787,926 B2 | 10/2017 | Yoshida | |
| 9,787,927 B2 | 10/2017 | Yoshida | |
| 9,838,633 B2 | 12/2017 | Muto et al. | |
| 9,838,637 B2 | 12/2017 | Muto et al. | |
| 9,876,975 B2 | 1/2018 | Yoshida et al. | |
| 9,900,539 B2 | 2/2018 | Yamasaki et al. | |
| 10,015,430 B2 | 7/2018 | Kobayashi et al. | |
| 10,347,679 B2 | 7/2019 | Kato et al. | |
| 10,425,600 B2 | 9/2019 | Sakuragi | |
| 10,609,316 B2 | 3/2020 | Kobayashi | |
| 10,629,642 B2 * | 4/2020 | Sugihara | H01L 27/14636 |
| 10,841,527 B2 * | 11/2020 | Park | G11C 11/4074 |
| 10,917,602 B2 | 2/2021 | Tsukuda et al. | |
| 2012/0175503 A1 | 7/2012 | Kuroda et al. | |
| 2013/0140440 A1 | 6/2013 | Kobayashi | |
| 2015/0062367 A1 | 3/2015 | Inui | |
| 2016/0227141 A1 | 8/2016 | Kobayashi et al. | |
| 2016/0301886 A1 | 10/2016 | Muto et al. | |
| 2017/0155839 A1 * | 6/2017 | Yamazaki | H04N 5/378 |
| 2018/0220089 A1 | 8/2018 | Sakuragi | |
| 2019/0098244 A1 * | 3/2019 | Kanehara | H04N 5/378 |
| 2019/0131337 A1 * | 5/2019 | Sugihara | H01L 27/14612 |
| 2020/0029044 A1 | 1/2020 | Inui | |
| 2020/0194491 A1 | 6/2020 | Inui et al. | |
| 2020/0219922 A1 * | 7/2020 | Sugihara | H01L 27/14612 |
| 2020/0273894 A1 | 8/2020 | Inui et al. | |
| 2020/0378828 A1 * | 12/2020 | Kobayashi | H01L 27/14634 |
| 2021/0021777 A1 * | 1/2021 | Kobayashi | H04N 5/379 |
| 2021/0084249 A1 * | 3/2021 | Nakazawa | H01L 25/167 |
| 2021/0127081 A1 * | 4/2021 | Morikawa | H01L 27/14636 |

FOREIGN PATENT DOCUMENTS

| | | |
|---|---|---|
| JP | 2017-055099 A | 3/2017 |
| JP | 2017-117828 A | 6/2017 |
| JP | 2018-125620 A | 8/2018 |

OTHER PUBLICATIONS

Search Report dated Jul. 30, 2020, in European Patent Application No. 20177334.8.

Office Action dated Mar. 19, 2021, in Japanese Patent Application No. 2019-101488.

* cited by examiner

PHOTOELECTRIC CONVERSION APPARATUS AND EQUIPMENT

BACKGROUND OF THE INVENTION

Field of the Invention

The present invention relates to a photoelectric conversion apparatus and an equipment.

Description of the Related Art

Japanese Patent Laid-Open No. 2018-125620 describes a solid-state image capturing apparatus having a structure in which a first semiconductor substrate, an insulator, and a second semiconductor substrate are stacked. Pixels, row selection signal lines, vertical shift registers, vertical signal lines, ground wirings, ground pads, and the like are arranged on the first semiconductor substrate, and differential amplifier circuits, storage capacitors, and the like are arranged on the second semiconductor substrate. A first via and a second via are provided to connect wirings provided on the first semiconductor substrate to wirings provided on the second semiconductor substrate. The first via is arranged in an electrical path between the vertical signal line arranged in a pixel array of the first semiconductor substrate and the differential amplifier circuit of the second semiconductor substrate. The second via is arranged in an electrical path between a ground line arranged in the pixel array of the first semiconductor substrate and one terminal of the storage capacitor of the second semiconductor substrate.

In an arrangement in which a potential such as a ground potential is supplied from an electrically conductive line such as a ground line arranged in a pixel array of one substrate to a readout circuit arranged on another substrate, shading may occur due to a change in potential of the electrically conductive line.

SUMMARY OF THE INVENTION

The present invention provides a technique advantageous in reducing shading.

A first aspect of the present invention provides a photoelectric conversion apparatus comprising: a first substrate including a pixel array; a second substrate including a readout circuit configured to read out a signal from the pixel array; and a drive terminal to which a drive potential is externally applied, wherein the readout circuit includes a first node to which the drive potential is supplied from the drive terminal via an electrically conductive line arranged in the pixel array, and a second node to which the drive potential is supplied from the drive terminal without going through the pixel array.

A second aspect of the present invention provides an equipment comprising: a photoelectric conversion apparatus as defined as the first aspect of the present invention; and an apparatus connected to the photoelectric conversion apparatus.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the following description, a "drive potential" means a ground potential or a power supply potential whose potential is higher than the ground potential, and a "drive terminal" means a terminal provided to apply a drive potential. A "connection" means an electrical connection. A connection (electrical connection) between two elements can include, in addition to a direct connection between the two elements, a connection between the two elements via another element. "Joining" provides an electrical connection.

Figure 1:
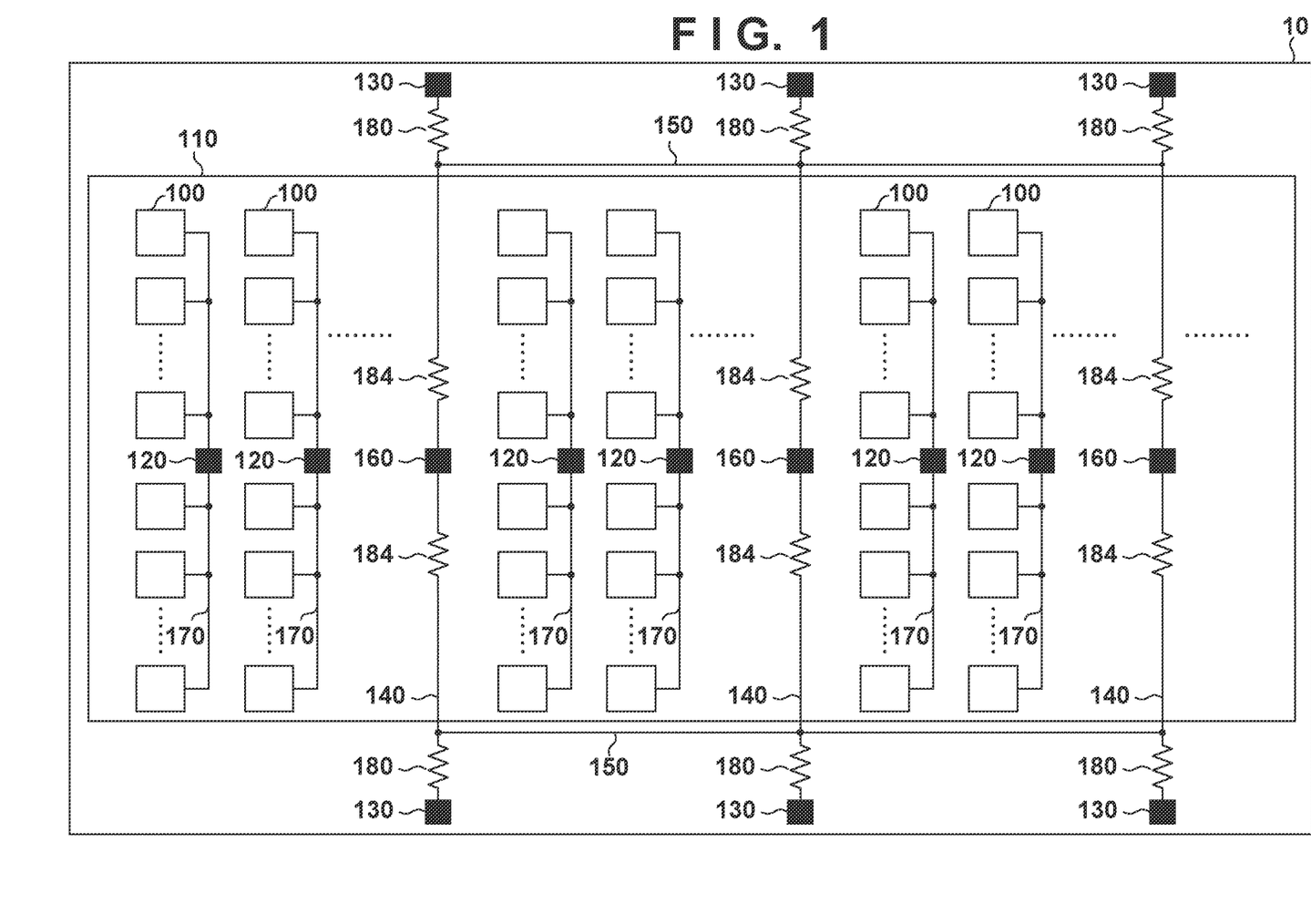
FIG. 1 is a view exemplarily showing the arrangement of a first substrate forming a photoelectric conversion apparatus according to an embodiment.
Figure 2:
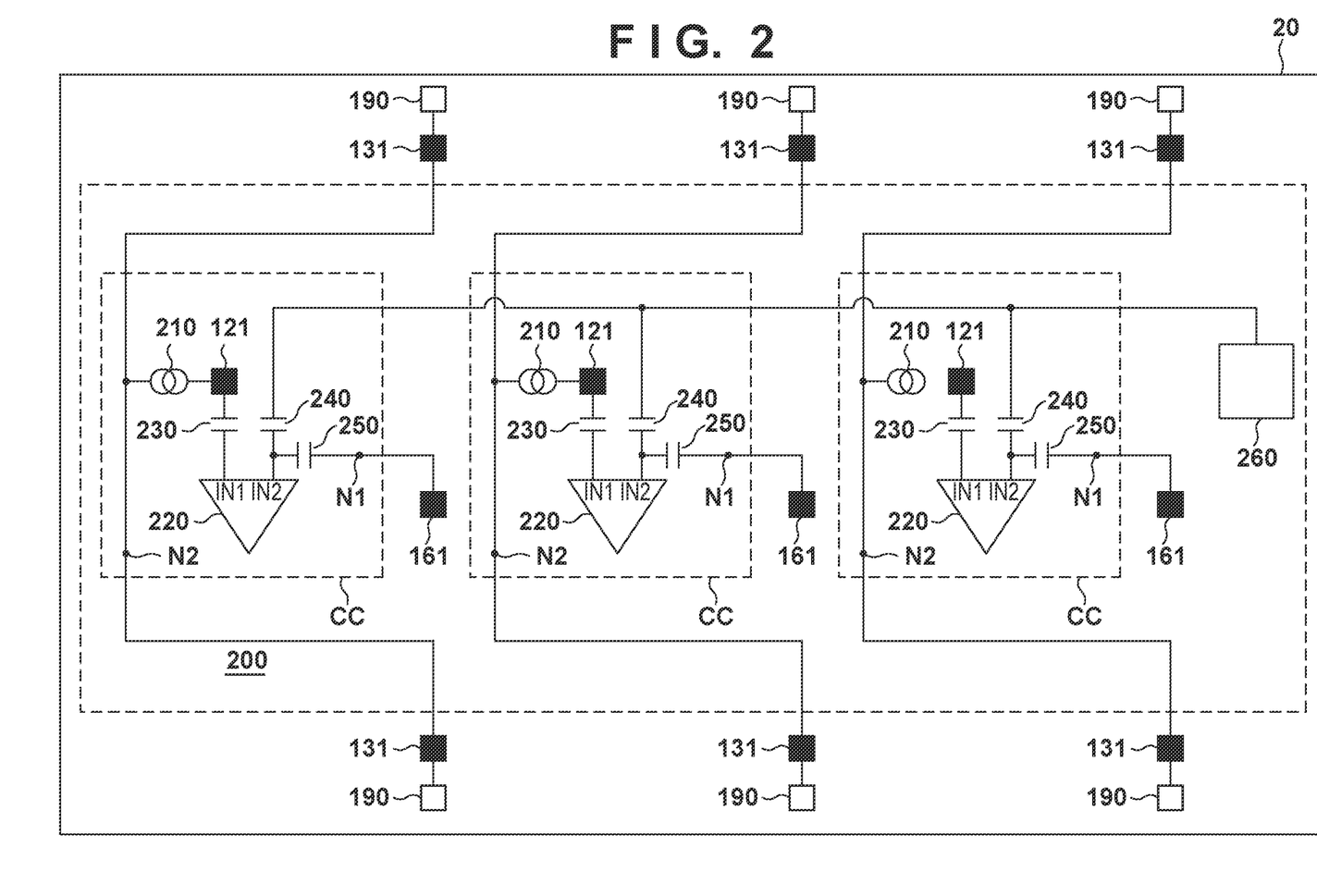
FIG. 2 is a view exemplarily showing the arrangement of a second substrate forming the photoelectric conversion apparatus according to the embodiment.
Figure 3:
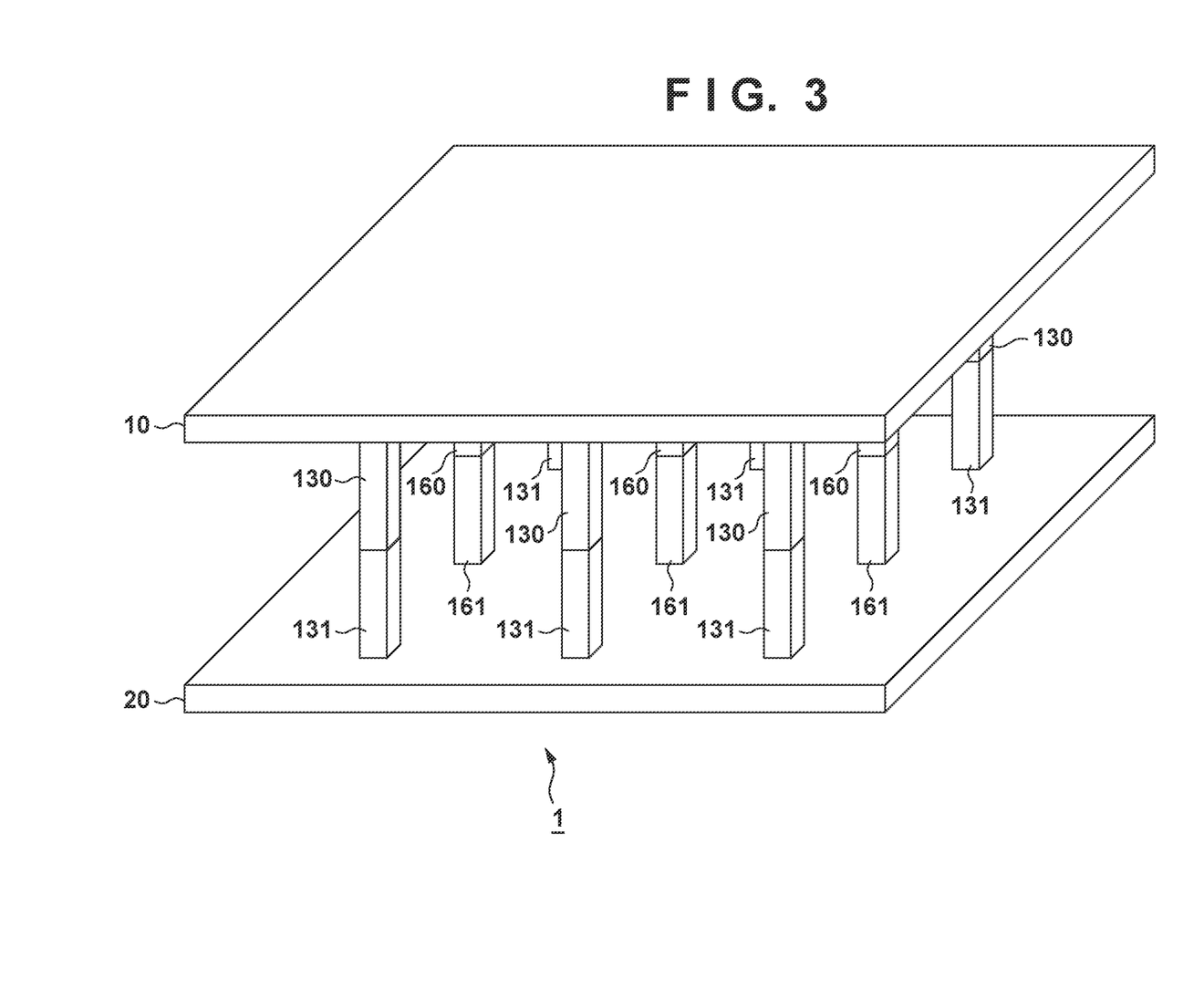
FIG. 3 is a view schematically showing the arrangement of the photoelectric conversion apparatus according to the embodiment.

With reference to FIGS. 1 to 4, a photoelectric conversion apparatus 1 according to an embodiment will be described. As schematically shown in FIG. 3, the photoelectric conversion apparatus 1 according to the embodiment can be formed by stacking a first substrate 10 and a second substrate 20. A joint 130 provided on the first substrate 10 and a joint 131 provided on the second substrate 20 can be joined to each other. A drive potential can be applied to the joints 130 and 131 from a drive terminal. A joint 160 provided on the first substrate 10 and a joint 161 provided on the second substrate 20 can be joined to each other. The drive potential can be applied to the joints 160 and 161 from the drive terminal via an electrically conductive line in a pixel array.

FIG. 1 schematically shows an arrangement example of the first substrate 10, and FIG. 2 schematically shows an arrangement example of the second substrate 20. The first substrate 10 includes a pixel array 110 including a plurality of pixels 100 so as to form a plurality of rows and a plurality of columns. The second substrate 20 includes a readout circuit 200 that reads out a signal from the pixel array 110 of the first substrate 10. A plurality of column signal lines 170 are arranged in the pixel array 110. The pixels 100 of the number corresponding to the number of rows in the pixel array 110 can be connected to each column signal line 170.

The column signal line 170 is connected to a joint 120. The joint 120 is connected to a joint 121 provided on the second substrate 20. Although the joints 120 and 121 are not shown in FIG. 3, the joints 120 and 121 are joined in a form similar to the joining between the joints 160 and 161. The joints 120 and 121 can be used to connect the column signal line 170 in the pixel array 110 of the first substrate 10 to the readout circuit 200 of the second substrate 20. The first substrate 10 can include the joint (first joint) 130 to which a ground potential as an example of the drive potential is applied, and the joint (third joint) 160 to which the ground potential as an example of the drive potential is applied. The second substrate 20 can include the joint (second joint) 131 to which the ground potential as an example of the drive potential is applied, and the joint (fourth joint) 161 to which the ground potential as an example of the drive potential is applied. The joint 130 of the first substrate 10 and the joint 131 of the second substrate 20 can be connected to each other. The joint 160 of the first substrate 10 and the joint 161 of the second substrate 20 can be connected to each other.

The joint 130 is arranged outside the pixel array 110 and connected to an electrically conductive line (ground line) 140, and the joint 160 is arranged in the pixel array 110 and connected to the electrically conductive line 140. That is, the joint 130 and the joint 160 are connected to each other by the electrically conductive line 140. A resistance 180 and a resistance 184 can be parasitic on the electrically conductive line 140. The resistance 180 is a resistance of the electrically conductive line 140 outside the pixel array 110, and the resistance 184 is a resistance of the electrically conductive line 140 in the pixel array 110 between the end portion of the pixel array 110 and the joint 160. The first substrate 10 can include a connecting line 150 that connects a plurality of the electrically conductive lines 140 to each other. The connecting line 150 can be arranged outside the pixel array 110 in orthographic projection to the first substrate 10 (in a planar view thereof).

The second substrate 20 includes the readout circuit 200 that reads out a signal from the pixel array 110, and the readout circuit 200 can include a plurality of column circuits CC provided such that one column circuit CC corresponds to one column signal line 170. In FIG. 2, only one of such column circuits CC is shown. The second substrate 20 can include a drive terminal (pad) 190 for externally applying the ground potential as the drive potential to the joint 131. Here, a plurality of the drive terminals 190 can be provided such that one drive terminal 190 corresponds to one joint 131.

The readout circuit 200 (column circuit CC) can be configured to read out a signal from the pixel 100 via the column signal line 170 and the joints 120 and 121. In another aspect, the readout circuit 200 (column circuit CC) can be configured to process a signal provided from the pixel 100 via the column signal line 170 and the joints 120 and 121. The readout circuit 200 (column circuit CC) can include a first node N1 to which the drive potential (ground potential) is supplied from the drive terminal 190 via the electrically conductive line 140 arranged in the pixel array 110 (and via the joints 131, 130, 160, and 161). The readout circuit 200 can also include a second node N2 to which the drive potential (ground potential) is supplied from the drive terminal 190 without going through the pixel array 110.

For example, the readout circuit 200 can be configured to operate as an AD converter that generates a digital signal corresponding to a signal (analog signal) provided from the pixel 100 via the column signal line 170 and the joints 120 and 121. The readout circuit 200 can include, for example, a current source 210, a differential amplifier (comparator) 220, a first capacitor 230, a second capacitor 250, and a third capacitor 240. The readout circuit 200 can include a supply source 260 that supplies a ramp signal as a reference potential to each column circuit CC.

The differential amplifier 220 includes a first input terminal IN1 and a second input terminal IN2. The current source 210 is arranged in a path connecting the column signal line 170 of the pixel array 110 (the joint 121 connected to the column signal line 170) and the joint 131. In one example, the current source 210 is arranged such that the joint 121 connected to the column signal line 170 of the pixel array 110 is directly connected to the joint 131. The first capacitor 230 is arranged in a path connecting the column signal line 170 (the joint 121 connected thereto) and the first input terminal IN1. The second capacitor 250 is arranged in a path connecting the first node N1 and the second input terminal IN2. The supply source 260 can supply a ramp signal as a reference potential to the second input terminal IN2 of the differential amplifier 220. Here, the ramp signal as the reference signal can be supplied to the second input terminal IN2 via the third capacitor 240. Although not shown, the readout circuit 200 includes a counter that starts counting when at the start of AD conversion and generates a count value. In addition, the column circuit CC includes a memory which is connected to the output terminal of the differential amplifier (comparator) 220 and to which the count value is input from the counter. The memory holds the count value in accordance with the inversion of the output of the differential amplifier (comparator) 220. This count value serves as a digital signal corresponding to the signal of the pixel 100. Note that the arrangement of the AD converter is not limited to this example and, for example, a counter connected to the output terminal of the differential amplifier (comparator) 220 may be provided in each column circuit CC. In this case, the counter stops counting in accordance with the inversion of the output of the differential amplifier (comparator) 220. Thus, a digital signal corresponding to the signal of the pixel 100 is generated by the counter.

Figure 4:
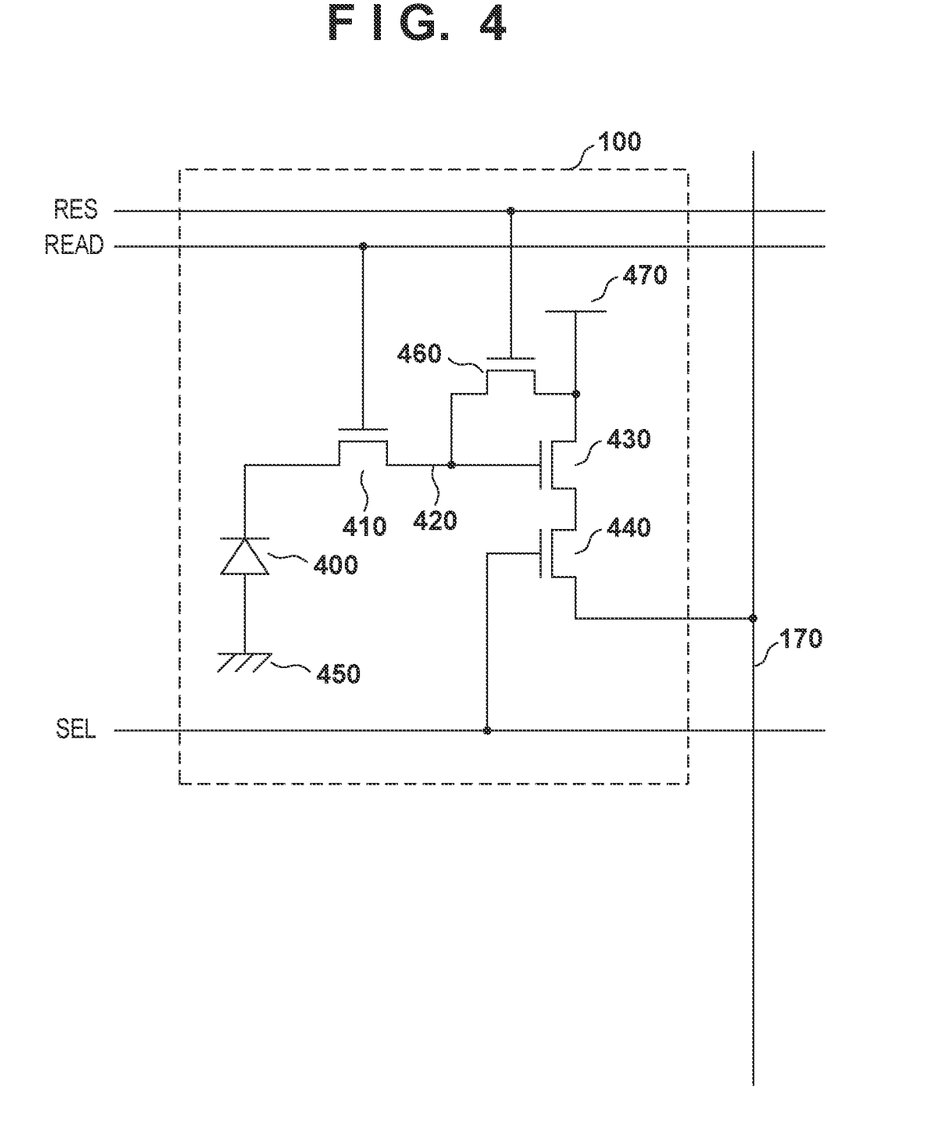
FIG. 4 is a view exemplarily showing the arrangement of a pixel in the photoelectric conversion apparatus according to the embodiment.

FIG. 4 shows an arrangement example of one pixel 100 arranged in the pixel array 110 of the first substrate 10. The pixel 100 can include, for example, a photoelectric converter 400, a transfer transistor 410, a charge-voltage converter (floating diffusion) 420, a source follower transistor 430, and a reset transistor 460. The photoelectric converter 400 is formed by, for example, a photodiode whose anode is connected to a ground line 450, and can photoelectrically convert incident light and accumulate generated charges. When a readout signal READ driven by a row drive circuit (not shown) is set at an active level, the transfer transistor 410 can transfer the charges accumulated in the photoelectric converter 400 to the charge-voltage converter 420. A potential corresponding to the amount of transferred charges appears in the charge-voltage converter 420. The source follower transistor 430 forms a source follower circuit together with the current source 210 connected to the column signal line 170, and outputs a signal corresponding to the potential of the charge-voltage converter 420 to the column signal line 170. The source follower transistor 430 is arranged so as to connect a power source line 470 to the column signal line 170. When a reset signal RES drives by the row drive circuit is set at an active level, the reset transistor 460 resets the potential of the charge-voltage converter 420.

The pixel 100 can further include a selection transistor 440. When a selection signal SEL driven by the row drive circuit is set at an active level (that is, when the pixel 100 is selected), the selection transistor 440 is turned on to enable driving of the column signal line 170 by the source follower transistor 430. The selection transistor 440 can be omitted. When the selection transistor 440 is omitted, the pixel 100 can be controlled to a selected state or a non-selected state by controlling the potential of the charge-voltage converter 420 to be reset by the reset transistor 460.

An operation of reading out a signal from the pixel 100 will be described with reference to FIG. 2. A signal of the pixel 100 that appears in the column signal line 170 is supplied to the first capacitor 230 of the column circuit CC via the joints 120 and 121. On the other hand, a ramp signal as a reference potential generated by the supply source 260 is supplied to the third capacitor 240 of the column circuit CC. The differential amplifier 220 operates as a comparator. The slope of the ramp signal supplied from the supply source 260 to the column circuit CC depends on the capacitance ratio between the second capacitor 250 and the third capacitor 240. The larger the capacitance of the second capacitor 250 than the capacitance of the third capacitor 240, the larger the slope of the ramp signal supplied to the differential amplifier 220. In other words, the larger the capacitance of the second capacitor 250 than the capacitance of the third capacitor 240, the larger the gain of AD conversion. By making the capacitance value of the second capacitor 250 and/or the third capacitor 240 variable, the gain of AC conversion may be made variable.

In one example, the ramp signal is generated such that its potential gradually decreases. When the potential of the second input terminal IN2 falls below the potential of the first input terminal IN1, the output signal of the differential amplifier 220 as the comparator is inverted, and this stops counting by the above-mentioned counter. Accordingly, the signal of the pixel 100 is read out as a digital signal.

A supply form of the ground potential as an example of the drive potential will be described below. The drive terminal 190 can be arranged on the second substrate 20. The ground potential supplied to the drive terminal 190 can be supplied to the electrically conductive line (ground line) 140 of the first substrate 10 via the joints 131 and 130. Here, a plurality of the drive terminals 190 can be arranged, and a plurality of the joints 131, a plurality of the joints 130, and a plurality of the electrically conductive lines 140 can be provided correspondingly. The plurality of the electrically conductive lines 140 can be connected to each other by the connecting line 150. The ground potential supplied to the electrically conductive line 140 of the first substrate 10 is supplied to the ground line 450 (see FIG. 4) of the pixel 100. In addition, the ground potential supplied to the pixel array 110 is further supplied to the second substrate 20 via the joints 160 and 161, and supplied to one terminal of the second capacitor 250 of each column circuit CC of the readout circuit 200.

According to this arrangement, when a potential change induced in the electrically conductive line 140 due to magnetic noise appears in the column signal line 170 via the pixel array 110, a similar potential change appears at the second input terminal IN2 of the differential amplifier 220 via the joints 160 and 161 and the second capacitor 250. That is, the influence of the potential change appearing in the first input terminal IN1 of the differential amplifier 220 due to magnetic noise is reduced by the potential change appearing in the first input terminal IN1 of the differential amplifier 220 due to the magnetic noise. As has been described above, by supplying the ground potential to the second capacitor 250 of the readout circuit 200 via the electrically conductive line 140 of the first substrate 10, the influence of magnetic noise is reduced, so that shading can be reduced.

In terms of reducing the influence of magnetic noise, it is preferable that the resistance value of the resistance 180 of the electrically conductive line 140 outside the pixel array 110 is larger than the resistance value of the resistance 184 of the electrically conductive line 140 in the pixel array 110. This is because since the electromotive force (noise) induced in the resistance 180 due to magnetic noise affects the pixels 100 in all rows of the pixel array 110 and the readout circuit 200, the influence of the magnetic noise can be reduced in reading out of a signal of the pixel 100 in any row. On the other hand, an electromotive force induced in the resistance 184 in the pixel array 110 is different for each row in which the pixel 100 is arranged, so that the influence of the magnetic noise is different between the rows. Therefore, in order to reduce the difference in influence of magnetic noise between the rows, the electromotive force induced in the resistance 184 in the pixel array 110 should be as small as possible.

In the example shown in FIG. 2, the ground potential is supplied to the current source 210 from the drive terminal 190 via the electrically conductive line of the second substrate 20 without going through the electrically conductive line 140 of the first substrate 10. Thus, it is possible to prevent the current flowing through the current source 210 from flowing through the electrically conductive line 140 of the first substrate 10. Accordingly, it is possible to prevent the potential of the electrically conductive line 140 from being changed by the resistance 184. In addition, since the resistance value of the resistance 180 can be increased, this is advantageous in reducing the influence of magnetic noise.

Here, the example has been described in which the ground potential is supplied to the current source 210 from the drive terminal 190 via the electrically conductive line of the second substrate 20 without going through the electrically conductive line 140 of the first substrate 10, but this is merely an example. A similar effect can be obtained by, for example, supplying the ground potential to the differential amplifier 220 from the drive terminal 190 via the electrically conductive line of the second substrate 20 without going through the electrically conductive line 140 of the first substrate 10. In the example shown in FIGS. 1 and 2, the joints 160 and 161 are arranged for every plurality of columns, but the joints 160 and 161 may be arranged for each column. By using the same drive terminal 190 to supply the ground potential to the current source 210 and to supply the ground potential to the electrically conductive line 140, the number of the drive terminals 190 can be reduced.

The drive terminal 190 may be provided on the first substrate 10, but is preferably provided on the second substrate 20. The latter is advantageous in stabilizing the potential of the ground line that supplies the ground potential to the current source 210 and reducing the influence of magnetic noise. This is because the parasitic resistance generated in the joints 130 and 131 outside the pixel array 110 is equivalent to an increase in the resistance 180. On the other hand, the parasitic resistance of the joints 160 and 161 in the pixel array 110 does not contribute to a reduction of the influence of magnetic noise. Accordingly, the parasitic resistance of the joints 160 and 161 should be smaller than the parasitic resistance of the joints 130 and 131. For example, the parasitic resistance of the joints can be reduced by increasing the number and/or size of the joints.

The connecting line 150 connecting the plurality of the electrically conductive lines 140 is advantageous in preventing the resistance of the ground line viewed from the pixel 100 in the pixel array 110 from changing depending on the position of the column. In addition, providing the connecting line 150 on the first substrate 10 is advantageous in improving the degree of freedom of arrangement of the drive terminal 190 on the second substrate 20. For example, it becomes easy to arrange different ground terminals and/or power supply terminals between the plurality of the drive terminals 190.

A node connecting the current source 210 and the first capacitor 230 can be understood as a signal input node for a signal from the pixel array 110 to the readout circuit 200 (column circuit CC). The concept of the embodiment may be understood as making the direction in which the potential of a signal provided to the signal input node of the readout circuit 200 changes due to noise and the direction in which the drive potential (ground potential) applied to the first node N1 changes due to the noise the same.

Figure 5:
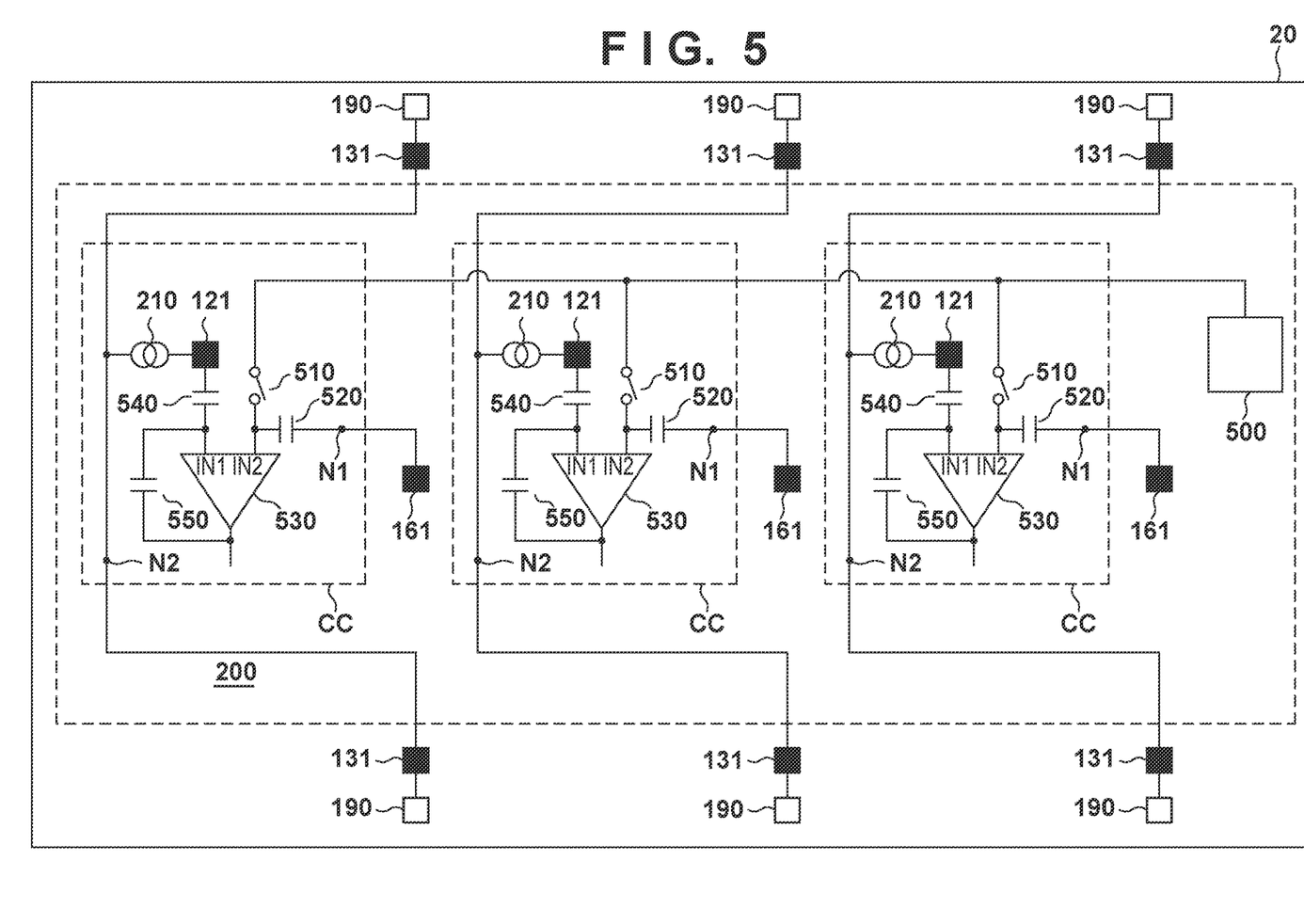
FIG. 5 is a view exemplarily showing another arrangement of the second substrate forming the photoelectric conversion apparatus according to the embodiment.

FIG. 5 shows another arrangement example of the embodiment. In the arrangement example shown in FIG. 5, the readout circuit 200 is configured as a gain amplifier. More specifically, the readout circuit 200 includes a differential amplifier 530, the current source 210, a first capacitor 540, a second capacitor 520, a third capacitor 550, and a switch 510. The differential amplifier 530 includes a first input terminal IN1 and a second input terminal IN2. The current source 210 is connected to the column signal line 170 of the pixel array 110. The first capacitor (input capacitance) 540 is arranged in a path connecting the column signal line 170 and the first input terminal IN1. The second capacitor (hold capacitance) 520 is arranged in a path connecting the first node N1 and the second input terminal IN2. The third capacitor (feedback capacitance) 550 is arranged in a path between the first input terminal IN1 and the output terminal of the differential amplifier 530. A supply source 500 supplies a reference potential to the second input terminal IN2. A ground potential is supplied to the current source 210 from the drive terminal 190 via the electrically conductive line arranged on the second substrate 20. The supply source 500 generates a fixed potential as the reference potential, and the fixed potential is supplied to the second input terminal IN2 via the switch 510. The differential amplifier 530, the first capacitor 540, and the third capacitor 550 forms the gain amplifier.

A signal provided to the joint 121 (signal input node) from the column signal line 170 while the reference potential is held by the second capacitor 520 is amplified by the gain amplifier formed by the differential amplifier 530, the first capacitor 540, and the third capacitor 550. In this arrangement, when a potential change induced in the electrically conductive line 140 due to magnetic noise appears in the column signal line 170 via the pixel array 110, a similar potential change appears in the second input terminal IN2 of the differential amplifier 530 via the joints 160 and 161 and the second capacitor 520. That is, the influence of the potential change appearing in the first input terminal IN1 of the differential amplifier 220 due to magnetic noise is reduced by the potential change appearing in the first input terminal IN1 of the differential amplifier 220 due to the magnetic noise.

The representative photoelectric conversion apparatus 1 according to the above-described embodiment can be formed as an image capturing apparatus that detects an optical image or a light intensity distribution as an electric image signal. As applications of the photoelectric conversion apparatus 1 formed as an image capturing apparatus, an electronic equipment such as a camera, smartphone, or general-purpose computer or a transportation equipment such as an automobile in which the image capturing apparatus is incorporated will be exemplified. The camera conceptually includes not only an apparatus whose principal purpose is shooting but also an apparatus (for example, a personal computer or a mobile terminal such as a tablet) additionally provided with a shooting function. Note that examples of the equipment incorporating the image capturing apparatus are an office equipment such as a copy machine or a scanner, a medical equipment for radiation diagnosis or endoscope observation, an industrial equipment such as an industrial robot, and an analysis equipment such as an electron microscope.

Figure 6:
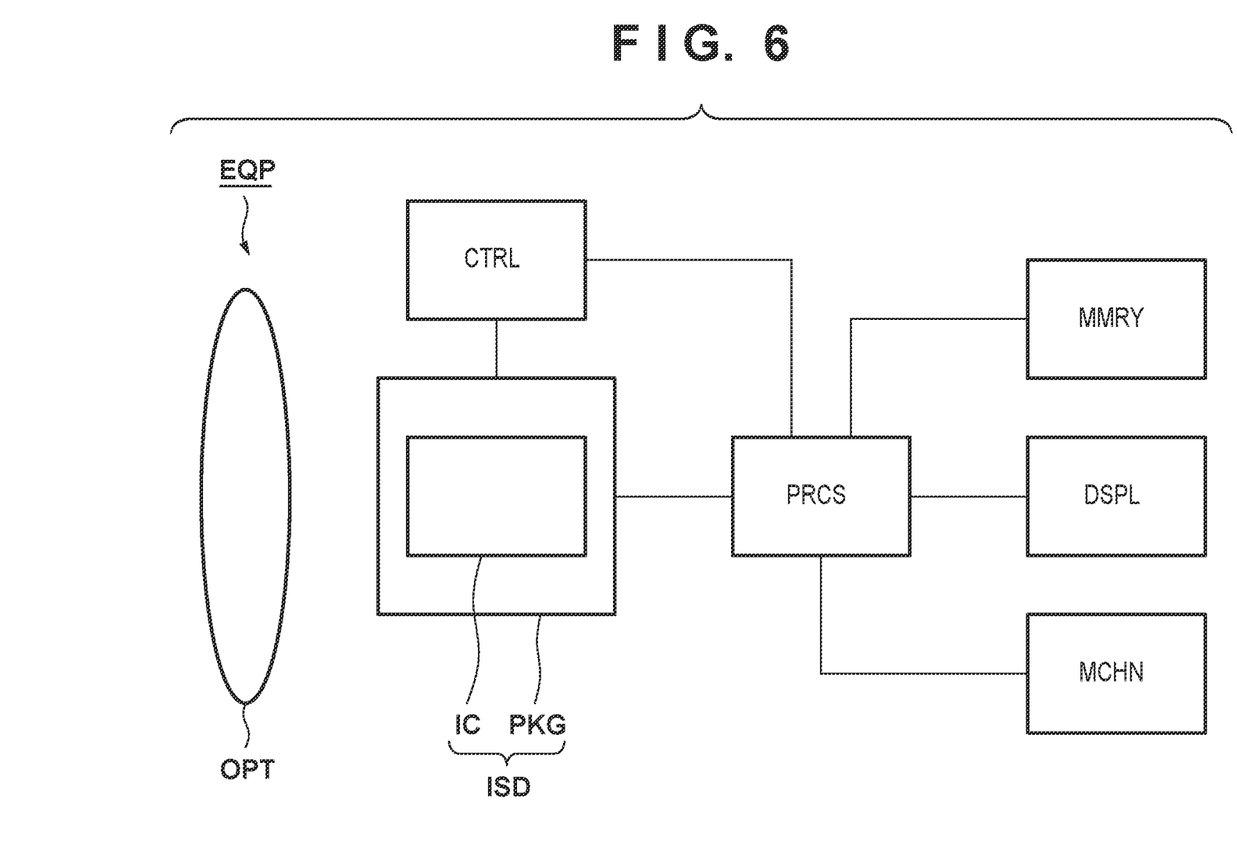
FIG. 6 is a block diagram showing the arrangement of an equipment according to the embodiment.

FIG. 6 is a schematic view showing an equipment EQP mounted with the photoelectric conversion apparatus 1 formed as an image capturing apparatus ISD. An example of the equipment EQP is an electronic equipment (information equipment) such as a camera or smartphone or a transportation equipment such as an automobile, ship, or airplane. The image capturing apparatus ISD can include a package PKG that stores a semiconductor device IC in addition to the semiconductor device IC including a semiconductor substrate (semiconductor chip). The package PKG can include a base on which the semiconductor device IC is fixed, a lid made of glass or the like facing the semiconductor device IC, and a connection member such as a bonding wire and bump for connecting a terminal of the base and a terminal of the semiconductor device IC. The equipment EQP can further include at least one of an optical system OPT, a control apparatus CTRL, a processing apparatus PRCS, a display apparatus DSPL, and a storage apparatus MMRY. The optical system OPT is a system that forms an optical image on the image capturing apparatus ISD and is implemented by, for example, a lens, a shutter, and a mirror. The control apparatus CTRL controls the operation of the image capturing apparatus ISD and is, for example, a semiconductor device such as an ASIC. The processing apparatus PRCS processes a signal output from the image capturing apparatus ISD and is a semiconductor device such as a CPU or ASIC for forming an AFE (Analog Front End) or a DFE (Digital Front End). The display apparatus DSPL is an EL display apparatus or liquid crystal display apparatus that displays information (image) obtained by the image capturing apparatus ISD. The storage apparatus MMRY is a magnetic device or semiconductor device that stores the information (image) obtained by the image capturing apparatus ISD. The storage apparatus MMRY is a volatile memory such as an SRAM or DRAM or a nonvolatile memory such as a flash memory or hard disk drive. A mechanical apparatus MCHN includes a moving or propulsion unit such as a motor or engine. The mechanical apparatus MCHN in the camera can drive the components of the optical system OPT in order to perform zooming, an in-focus operation, and a shutter operation. The equipment EQP displays the signal output from the image capturing apparatus ISD on the display apparatus DSPL and performs external transmission by a communication apparatus (not shown) of the equipment EQP. For this purpose, the equipment EQP may further include the storage apparatus MMRY and the processing apparatus PRCS in addition to the memory circuits and arithmetic circuits included in the control/signal processing circuits in which the image capturing apparatus ISD can be incorporated.

Figure 7A:
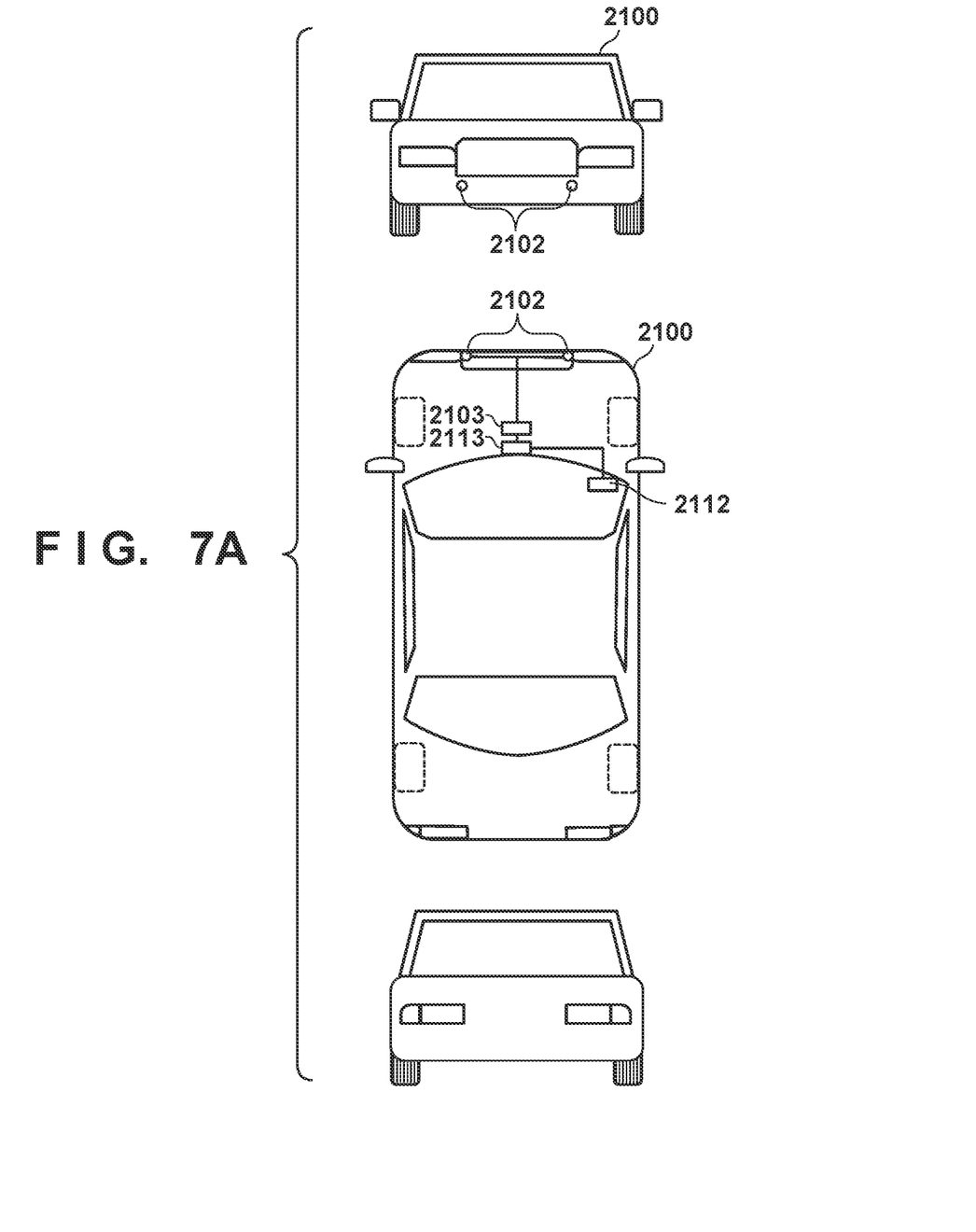
FIGS. 7A and 7B are views showing the arrangement of an equipment according to another embodiment.

As described above, the photoelectric conversion apparatus 1 is advantageous in reducing shading. Therefore, a camera incorporating the photoelectric conversion apparatus 1 is suitable as a surveillance camera, an onboard camera mounted in a transportation equipment such as an automobile or railroad car, or the like. An example in which the camera incorporating the photoelectric conversion apparatus 1 is applied to a transportation equipment will be exemplified. A transportation equipment 2100 can be, for example, an automobile including an onboard camera system 2101 shown in FIGS. 7A and 7B. FIG. 7A schematically shows the outer appearance and the main internal structure of the transportation equipment 2100. The transportation equipment 2100 includes photoelectric conversion apparatuses 2102, an image capturing system integrated circuit (ASIC: Application Specific Integrated Circuit) 2103, a warning apparatus 2112, and a control apparatus 2113.

The above-described photoelectric conversion apparatus 1 is used as each photoelectric conversion apparatus 2102. The warning apparatus 2112 warns a driver when it receives an abnormality signal from an image capturing system, a vehicle sensor, a control unit, or the like. The control apparatus 2113 comprehensively controls the operations of the image capturing system, the vehicle sensor, the control unit, and the like. Note that the transportation equipment 2100 need not include the control apparatus 2113. In this case, the image capturing system, the vehicle sensor, and the control unit each individually include a communication interface and transmit/receive control signals via a communication network (for example, CAN standards).

Figure 7B:
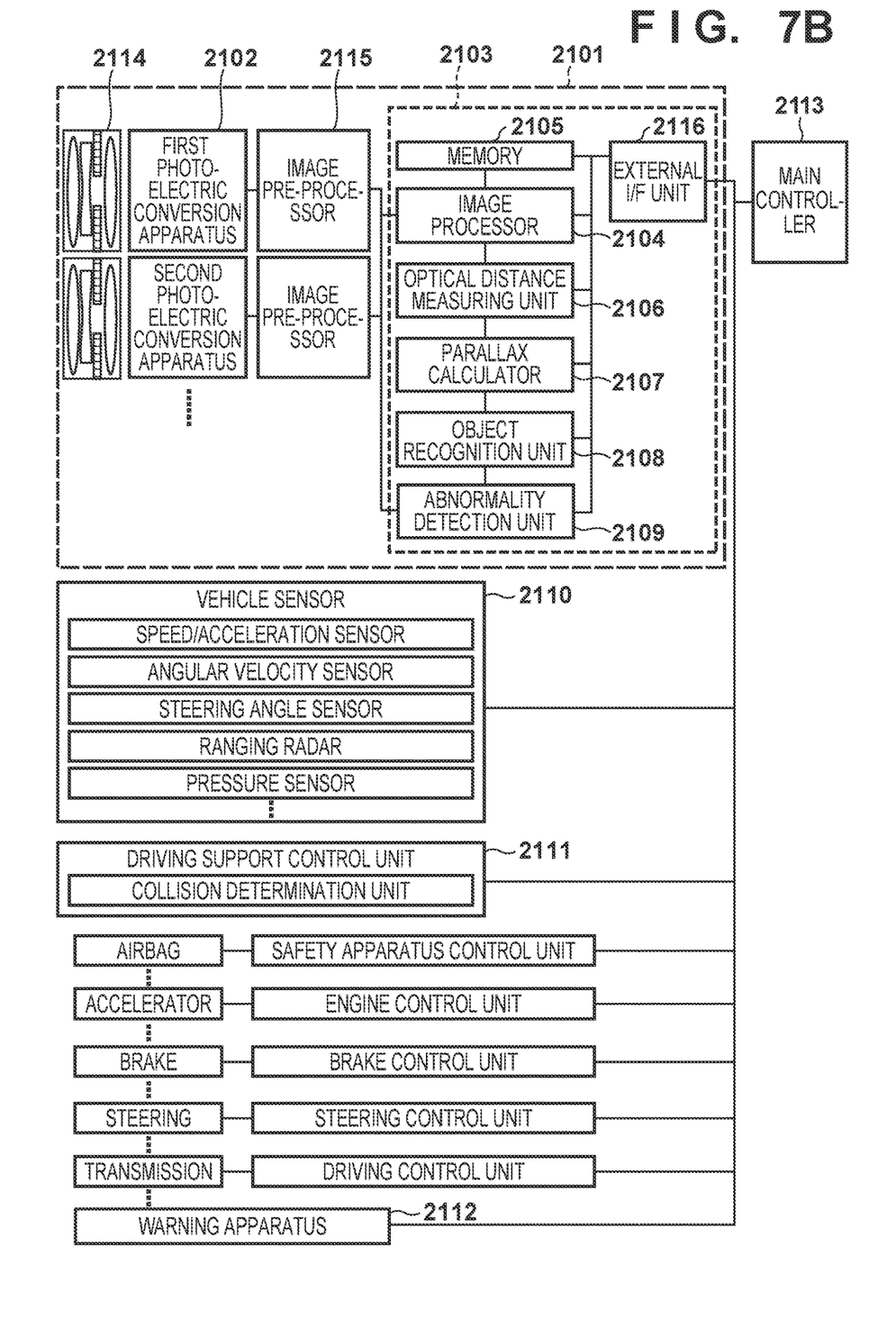

FIG. 7B is a block diagram showing the system arrangement of the transportation equipment 2100. The transportation equipment 2100 includes the first photoelectric conversion apparatus 2102 and the second photoelectric conversion apparatus 2102. That is, the onboard camera according to this embodiment is a stereo camera. An object image is formed by each optical unit 2114 on each photoelectric conversion apparatus 2102. A pixel signal output from each photoelectric conversion apparatus 2102 is processed by an image preprocessor 2115 and transmitted to the image capturing system integrated circuit 2103. The image preprocessor 2115 performs processing such as S-N calculation and synchronization signal addition. A signal processor 902 corresponds to at least part of the image preprocessor 2115 and the image capturing system integrated circuit 2103.

The image capturing system integrated circuit 2103 includes an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 generates an image signal by processing signals output from the pixels of each photoelectric conversion apparatus 2102. The image processor 2104 also performs correction of the image signal and interpolation of an abnormal pixel. The memory 2105 temporarily holds the image signal. The memory 2105 may also store the position of a known abnormal pixel in the photoelectric conversion apparatus 2102. The optical distance measurement unit 2106 uses the image signal to perform focusing or distance measurement of an object. The parallax calculation unit 2107 performs object collation (stereo matching) of a parallax image. The object recognition unit 2108 analyzes the image signal to recognize objects such as a transportation equipment, a person, a road sign, and a road. The abnormality detection unit 2109 detects the fault or an error operation of the photoelectric conversion apparatus 2102. When a fault or an error operation is detected, the abnormality detection unit 2109 transmits a signal indicating the detection of an abnormality to the control apparatus 2113. The external I/F unit 2116 mediates exchange of information between the units of the image capturing system integrated circuit 2103 and the control apparatus 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. Based on the pieces of information from the optical distance measurement unit 2106, the parallax calculation unit 2107, and the object recognition unit 2108, the collision determination unit determines whether there is the possibility of a collision with an object. The optical distance measurement unit 2106 and the parallax calculation unit 2107 are examples of distance information acquisition units that acquire distance information of a target object. That is, distance information includes pieces of information concerning the parallax, the defocus amount, the distance to the target object, and the like. The collision determination unit may use one of these pieces of distance information to determine the possibility of a collision. Each distance information acquisition unit may be implemented by specially designed hardware or a software module.

An example in which the driving support unit 2111 controls the transportation equipment 2100 so as to avoid a collision with another object has been described. However, the present invention is also applicable to control for automated driving following another vehicle or automated driving without deviation from a lane.

The transportation equipment 2100 also includes driving apparatuses which are used for movement or for supporting the movement, such as an air bag, an accelerator, a brake, a steering wheel, a transmission, an engine, a motor, wheels, and propellers. The transportation equipment 2100 also includes control units for these apparatuses. Each control unit controls a corresponding driving apparatus based on a control signal of the control apparatus 2113.

The image capturing system used in this embodiment is applicable not only to an automobile and a railroad car but also to, for example, an equipment such as a ship, an airplane, or an industrial robot. In addition, the image capturing system is applicable not only to a transportation equipment but also to an equipment that widely uses object recognition, such as ITS (Intelligent Transportation System).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-101488, filed May 30, 2019, which is hereby incorporated by reference herein in its entirety.

What is claimed is:

1. A photoelectric conversion apparatus comprising:
   a first substrate including a pixel array having a plurality of pixels;
   a second substrate including a readout circuit configured to read out a signal from a pixel of the plurality of the pixels in the pixel array; and
   a drive terminal provided on the first substrate or the second substrate, wherein a drive potential, which is a ground potential or a power supply potential, is applied to the drive terminal from an outside of the photoelectric conversion apparatus,
   wherein the readout circuit includes a first node to which the drive potential is supplied from the drive terminal via an electrically conductive line arranged in the pixel array, and a second node to which the drive potential is supplied from the drive terminal without going through the pixel array.

2. The apparatus according to claim 1, wherein the readout circuit includes a signal input node to which a signal from the pixel array is provided, and a direction in which a potential of the signal provided to the signal input node from the pixel array changes due to noise is same as a direction in which the drive potential applied to the first node changes due to the noise.

3. The apparatus according to claim 1, wherein the drive potential is the ground potential.

4. The apparatus according to claim 2, wherein the drive potential is the ground potential.

5. The apparatus according to claim 3, wherein the readout circuit includes a differential amplifier including a first input terminal and a second input terminal, a current source arranged in a path connecting a column signal line of the pixel array and the second node, a first capacitor arranged in a path connecting the column signal line and the first input terminal, a second capacitor arranged in a path connecting the first node and the second input terminal, and a supply source configured to supply a reference potential to the second input terminal.

6. The apparatus according to claim 4, wherein the readout circuit includes a differential amplifier including a first input terminal and a second input terminal, a current source arranged in a path connecting a column signal line of the pixel array and the second node, a first capacitor arranged in a path connecting the column signal line and the first input terminal, a second capacitor arranged in a path connecting the first node and the second input terminal, and a supply source configured to supply a reference potential to the second input terminal.

7. The apparatus according to claim 5, wherein the supply source generates a ramp signal as the reference potential, and the ramp signal is supplied to the second input terminal via a third capacitor.

8. The apparatus according to claim 6, wherein the supply source generates a ramp signal as the reference potential, and the ramp signal is supplied to the second input terminal via a third capacitor.

9. The apparatus according to claim 5, wherein the supply source generates a fixed potential as the reference potential, and the fixed potential is supplied to the second input terminal via a switch.

10. The apparatus according to claim 6, wherein the supply source generates a fixed potential as the reference potential, and the fixed potential is supplied to the second input terminal via a switch.

11. The apparatus according to claim 3, wherein the readout circuit includes a differential amplifier including a first input terminal and a second input terminal, a current source connected to a column signal line of the pixel array, a first capacitor arranged in a path connecting the column signal line and the first input terminal, a second capacitor arranged in a path connecting the first node and the second input terminal, and a supply source configured to supply a reference potential to the second input terminal, and the drive potential is supplied from the second node to the differential amplifier.

12. The apparatus according to claim 4, wherein the readout circuit includes a differential amplifier including a first input terminal and a second input terminal, a current source connected to a column signal line of the pixel array, a first capacitor arranged in a path connecting the column signal line and the first input terminal, a second capacitor arranged in a path connecting the first node and the second input terminal, and a supply source configured to supply a reference potential to the second input terminal, and the drive potential is supplied from the second node to the differential amplifier.

13. The apparatus according to claim 1, wherein the drive potential is a power supply potential.

14. The apparatus according to claim 1, wherein the drive terminal is arranged on the second substrate.

15. The apparatus according to claim 1, further comprising:
a plurality of electrically conductive lines including the electrically conductive line; and
a connecting line connecting the plurality of electrically conductive lines to each other,
wherein the connecting line is arranged outside the pixel array in orthographic projection to the first substrate.

16. The apparatus according to claim 1, wherein
the first substrate includes a first joint arranged outside the pixel array, and the second substrate includes a second joint supplied with the drive potential from the drive terminal and jointed to the first joint,
the electrically conductive line arranged in the pixel array extends to the first joint,
the first substrate includes a third joint arranged in the pixel array and connected to the electrically conductive line, and the second substrate includes a fourth joint joined to the third joint and connected to the first node, and
a resistance value of the electrically conductive line outside the pixel array is larger than a resistance value of the electrically conductive line in the pixel array between an end portion of the pixel array and the third joint.

17. The apparatus according to claim 15, wherein
the first substrate includes a first joint arranged outside the pixel array, and the second substrate includes a second joint supplied with the drive potential from the drive terminal and jointed to the first joint,
the electrically conductive line arranged in the pixel array extends to the first joint,
the first substrate includes a third joint arranged in the pixel array and connected to the electrically conductive line, and the second substrate includes a fourth joint joined to the third joint and connected to the first node, and
a resistance value of the electrically conductive line outside the pixel array is larger than a resistance value of the electrically conductive line in the pixel array between an end portion of the pixel array and the third joint.

18. An equipment comprising:
a photoelectric conversion apparatus defined in claim 1; and
an apparatus connected to the photoelectric conversion apparatus.

* * * * *